(12) United States Patent
Gao

(10) Patent No.: US 9,711,544 B2
(45) Date of Patent: Jul. 18, 2017

(54) THIN FILM TRANSISTOR AND MANUFACTURING METHOD THEREOF, ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventor: Tao Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/368,308

(22) PCT Filed: Aug. 1, 2013

(86) PCT No.: PCT/CN2013/080646
§ 371 (c)(1),
(2) Date: Jun. 24, 2014

(87) PCT Pub. No.: WO2014/166181
PCT Pub. Date: Oct. 16, 2014

(65) Prior Publication Data
US 2015/0194450 A1    Jul. 9, 2015

(30) Foreign Application Priority Data
Apr. 12, 2013    (CN) .......................... 2013 1 0126140

(51) Int. Cl.
*H01L 21/027*    (2006.01)
*H01L 27/12*    (2006.01)
(Continued)

(52) U.S. Cl.
CPC ...... *H01L 27/1288* (2013.01); *H01L 21/0271* (2013.01); *H01L 21/0272* (2013.01);
(Continued)

(58) Field of Classification Search
CPC ............. H01L 27/1214; H01L 27/1288; H01L 27/1248; H01L 21/0272
See application file for complete search history.

(56) References Cited

U.S. PATENT DOCUMENTS

2010/0055817 A1* 3/2010 Song ................. G02F 1/133555
438/30
2010/0093122 A1* 4/2010 Min .................... H01L 27/1214
438/30
(Continued)

FOREIGN PATENT DOCUMENTS

CN    1912725 A    2/2007
CN    102122620 A    7/2011
(Continued)

OTHER PUBLICATIONS

PCT International Search Report (Chinese language) for PCT/CN2013/080646 issued by the State Intellectual Property Office ("SIPO") on Jan. 23, 2014, 12 pages.
(Continued)

*Primary Examiner* — Jaehwan Oh
(74) *Attorney, Agent, or Firm* — Ladas & Parry LLP

(57) ABSTRACT

Embodiments of the disclosure provide a thin film transistor and a manufacturing method thereof, an array substrate and a manufacturing method thereof, and a display device. The thin film transistor comprises a substrate (1), and a gate electrode (2), a source electrode (41) and a drain electrode (42) provided on the substrate. A projection of a gap between the source electrode (41) and the drain electrode (42) on the substrate (1) coincides with a projection of the gate electrode (2) on the substrate (1).

6 Claims, 3 Drawing Sheets

(51) Int. Cl.
*H01L 29/66* (2006.01)
*H01L 21/283* (2006.01)
*H01L 21/3213* (2006.01)
*H01L 29/423* (2006.01)
*H01L 29/786* (2006.01)
*H01L 29/417* (2006.01)

(52) U.S. Cl.
CPC ........ *H01L 21/0274* (2013.01); *H01L 21/283* (2013.01); *H01L 21/32133* (2013.01); *H01L 29/41733* (2013.01); *H01L 29/42384* (2013.01); *H01L 29/66765* (2013.01); *H01L 29/78669* (2013.01); *H01L 29/78678* (2013.01)

(56) References Cited

U.S. PATENT DOCUMENTS

| | | | |
|---|---|---|---|
| 2010/0230682 A1* | 9/2010 | Song | H01L 27/127 257/59 |
| 2010/0301325 A1* | 12/2010 | Bae | H01L 27/1225 257/43 |
| 2011/0007234 A1* | 1/2011 | Liu | H01L 27/1214 349/43 |
| 2011/0050672 A1* | 3/2011 | Choi | G02F 1/136286 345/211 |
| 2011/0273639 A1* | 11/2011 | Xie | G02F 1/136286 349/43 |
| 2011/0297929 A1* | 12/2011 | Liu | H01L 27/1214 257/43 |
| 2012/0069286 A1* | 3/2012 | Huang | G02F 1/136227 349/147 |
| 2013/0200383 A1 | 8/2013 | Jia et al. | |
| 2014/0011329 A1* | 1/2014 | Zhang | H01L 29/66969 438/158 |
| 2014/0035478 A1* | 2/2014 | Kitakado | H01L 29/7869 315/210 |

FOREIGN PATENT DOCUMENTS

| | | |
|---|---|---|
| CN | 102543863 A | 7/2012 |
| CN | 102854667 A | 1/2013 |

OTHER PUBLICATIONS

English Abstract of CN1912725A (listed above under Foreign Patent Documents); 1 pg.
English Abstract of CN102122620A (listed above under Foreign Patent Documents); 1 pg.
First Office Action from State Intellectual Property Office of the People's Republic of China for Application No. CN20131026140.9; issued on Mar. 24, 2015; 8 pgs.
English translation of First Office Action from State Intellectual Property Office of the People's Republic of China for Application No. CN20131026140.9; issued on Mar. 24, 2015; 7 pgs.
English Abstract of CN102543863A (listed above under Foreign Patent Documents); 1 pg.
English Abstract of CN102854667A (listed above under Foreign Patent Documents); 1 pg.
Second Chinese Office Action dated Oct. 9, 2015; Appln. No. 201310126140.9.
International Preliminary Report on Patentability issued Oct. 13, 2015; PCT/CN2013/080646.

* cited by examiner

THIN FILM TRANSISTOR AND MANUFACTURING METHOD THEREOF, ARRAY SUBSTRATE AND MANUFACTURING METHOD THEREOF, DISPLAY DEVICE

CROSS REFERENCE TO RELATED APPLICATIONS

This application is based on International Application No. PCT/CN2013/080646 filed on Aug. 1, 2013, which claims priority to Chinese National Application No. 201310126140.9 filed on Apr. 12, 2013. The entire contents of each and every foregoing application are incorporated herein by reference.

TECHNICAL FIELD

Embodiments of the disclosure relate to a thin film transistor and a manufacturing method thereof, an array substrate comprising the thin film transistor and a manufacturing method of the array substrate, and a display device comprising the array substrate.

BACKGROUND

Thin film transistor liquid crystal display (TFT-LCD) is featured with small size, low power consumption, no-radiation and the like, and thus dominates the current flat-panel display market.

In the TFT-LCD, a source electrode and a drain electrode of the TFT are electrically connected with each other through a semiconductor channel in the case that a high level is applied to a gate electrode of the TFT, and a data signal from a data line is applied to a pixel electrode through the TFT. Total capacitance of the TFT=$C_{gs}+C_{channel}+C_{gd}$, wherein $C_{gs}$ represents a capacitance formed due to an overlapping of the gate electrode and the source electrode, and $C_{gd}$ is capacitance formed due to an overlapping of the gate electrode and the drain electrode. It is expected that both $C_{gs}$ and $C_{gd}$ are equal to 0, so as to reduce the total capacitance of the TFT. However, at present, the source electrode and the drain electrode inevitably overlap with the gate electrode, because electrical properties of the TFT will be affected if a gap between the source electrode and the drain electrode is large. In addition, among a plurality of TFTs, relative positions of the source electrode and the drain electrode with respect to the gate electrode are nonuniform, and thus $C_{gs}$ and $C_{gd}$ among the TFTs are different and the TFTs are different from one another in the total capacitances. In this case, the pixel electrodes are charged with different voltages even though the same data signal is applied, which will cause an uneven chrominance when an image is displayed by the liquid crystal display. In addition, a driving voltage of the TFT is increased due to the existence of $C_{gs}$ and $C_{gd}$, and thus the duration required by the charging process is increased.

SUMMARY

According to some embodiments of the disclosure, a thin film transistor is provided. The thin film transistor comprises a substrate, and a gate electrode, a source electrode and a drain electrode provided on the substrate. A projection of a gap between the source electrode and the drain electrode on the substrate coincides with a projection of the gate electrode on the substrate For example, the thin film transistor is a bottom-gate thin film transistor.

For example, the thin film transistor further comprises a gate insulating layer covering the gate electrode and a semiconductor active layer provided on the gate insulating layer.

For example, the thin film transistor further comprises an ohmic contact layer provided between the semiconductor active layer and the source and drain electrodes.

According to some embodiments of the disclosure, an array substrate is provided. The array substrate comprises the thin film transistor mentioned above.

For example, the array substrate further comprises a transparent conductive layer and a transparent conductive electrode provided on the substrate; and the transparent conductive layer is provided below the gate electrode of the thin film transistor, and the transparent conductive electrode is provided in a same layer as the transparent conductive layer.

For example, the transparent conductive electrode is served as a pixel electrode and is electrically connected to the drain electrode of the thin film transistor.

According to some embodiments of the disclosure, a manufacturing method of a thin film transistor is provided. The method comprises steps of: forming a gate electrode, a gate insulating layer, a semiconductor active layer and an ohmic contact layer on a substrate; exposing and developing a photoresist on the substrate from a back side of the substrate by taking the gate electrode as a mask plate, wherein a remaining portion of the photoresist after exposing and developing is in correspondence with a position of the gate electrode; forming a source-drain metal thin film on the substrate; stripping off the remaining portion of the photoresist and the source-drain metal thin film on the remaining portion of the photoresist to form a gap between a source electrode and a drain electrode of the thin film transistor; etching the ohmic contact layer in the gap; and etching the source-drain metal thin film to form the source electrode and the drain electrode.

According to some embodiments of the disclosure, a manufacturing method of an array substrate is provided. The method comprises steps of: forming a gate electrode, a gate line, a gate insulating layer, a semiconductor active layer, an ohmic contact layer and a transparent conductive electrode on a substrate; exposing and developing a photoresist on the substrate from a back side of the substrate by taking the gate electrode as a mask plate, wherein a remaining portion of the photoresist after exposing and developing is in correspondence with the position of the gate electrode; forming a source-drain metal thin film on the substrate; stripping off the remaining portion of the photoresist on the ohmic contact layer and the source-drain metal thin film on the remaining portion of the photoresist, to form a gap between a source electrode and a drain electrode of a TFT; etching the ohmic contact layer in the gap; and forming the source electrode, the drain electrode, a data line and a passivation layer on the substrate.

For example, the step of forming the gate electrode, the gate line, the gate insulating layer, the semiconductor active layer, the ohmic contact layer and the transparent conductive electrode on the substrate comprises: sequentially forming a transparent conductive thin film and a gate metal thin film on the substrate; coating a layer of photoresist on the substrate, exposing and developing the photoresist through a dual-tone mask plate so as to form a photoresist-completely-reserved region, a photoresist-partially-reserved region and a photoresist-completely-removed region, wherein the photoresistcompletely-reserved region corresponds to a region where the gate electrode and the gate line are to be formed, the photoresist-partially-reserved region corresponds to a region where the transparent conductive electrode is to be formed, and a remaining region is the photoresist-completely-removed region; etching the gate metal thin film and the transparent conductive thin film of the photoresist-completely-removed region through an etching process, to form the gate electrode and the gate line; removing the photoresist of the photoresist-partially-reserved region by an ashing process; etching the gate metal thin film of the photoresist-partially-reserved region through an etching process; stripping off the photoresist of the photoresist-completely-reserved region; sequentially forming a gate insulating layer thin film, a semiconductor active layer thin film and an ohmic contact layer thin film on the substrate; coating a layer of photoresist on the substrate, exposing and developing the photoresist through a dual-tone mask plate so as to form a photoresist-completely-reserved region, a photoresist-partially-reserved region and a photoresist-completely-removed region, wherein the photoresist-completely-reserved region corresponds to a region where the active layer of the TFT is to be formed, the photoresist-partially-reserved region corresponds to a region where the gate line is formed, and a remaining region is the photoresist-completely-removed region; etching the ohmic contact layer thin film, the semiconductor active layer thin film and the gate insulating layer thin film of the photoresist-completely-removed region through an etching process, to form the semiconductor active layer and the ohmic contact layer; removing the photoresist of the photoresist-partially-reserved region by an ashing process; etching the ohmic contact layer thin film and the semiconductor active layer thin film of the photoresist-partially-reserved region through an etching process; and reserving a remaining portion of photoresist of the photoresist-completely-reserved region.

For example, the step of forming the source electrode, the drain electrode, the data line and the passivation layer on the substrate comprises: forming a passivation layer thin film on the substrate; coating a layer of photoresist on the substrate, exposing and developing the photoresist through the dual-tone mask plate so as to form a photoresist-completely-reserved region, a photoresist-partially-reserved region and a photoresist-completely-removed region, wherein the photoresist-completely-reserved region corresponds to a region where the active layer of the TFT is formed, the photoresist-partially-reserved region corresponds to a region where the data line is formed, and a remaining region is the photoresist-completely-removed region; etching the passivation layer thin film of the photoresist-completely-removed region through an etching process; etching the source-drain metal thin film of the photoresist-completely-removed region through an etching process; removing the photoresist of the photoresist-partially-reserved region by an ashing process; etching the passivation layer thin film of the photoresist-partially-reserved region through an etching process; and stripping off a remaining portion of the photoresist of the photoresist-completely-reserved region.

According to some embodiments of the disclosure, a display device is provided. The display device comprises the above-mentioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
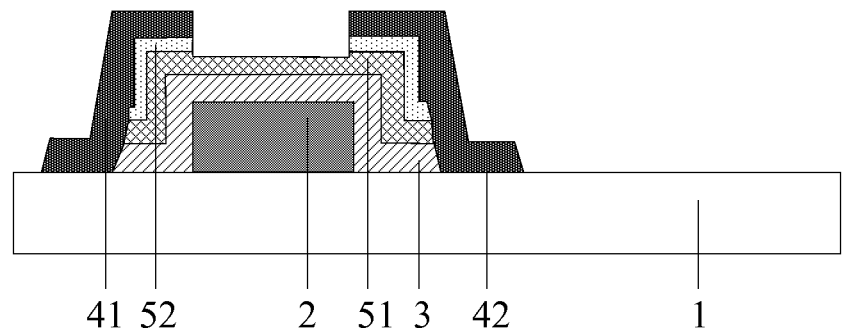
FIG. 1 is a structural schematic diagram illustrating a thin film transistor according to some embodiments of the disclosure.

According to some embodiments of the disclosure, a thin film transistor (TFT) is provided. As shown in FIG. 1, the thin film transistor comprises a substrate 1, and a gate electrode 2, a source electrode 41 and a drain electrode 42 provided on the substrate 1. A projection of a gap between the source electrode 41 and the drain electrode 42 coincides with a projection of the gate electrode 2 on the substrate 1. That is, an area of the projection of the gap between the source electrode 41 and the drain electrode 42 is identical to an area of the projection of the gate electrode 2 on the substrate 1.

For example, the thin film transistor according to the embodiments of the disclosure is a bottom-gate thin film transistor, i.e., the gate electrode 2 is provided below the source electrode 41 and the drain electrode 42. Furthermore, the TFT further comprises a gate insulating layer 3 covering the gate electrode 2, a semiconductor active layer 51 provided on the gate insulating layer 3, and an ohmic contact layer 52 provided between the semiconductor active layer 51 and the source electrode 41 and the drain electrode 42.

Figure 2:
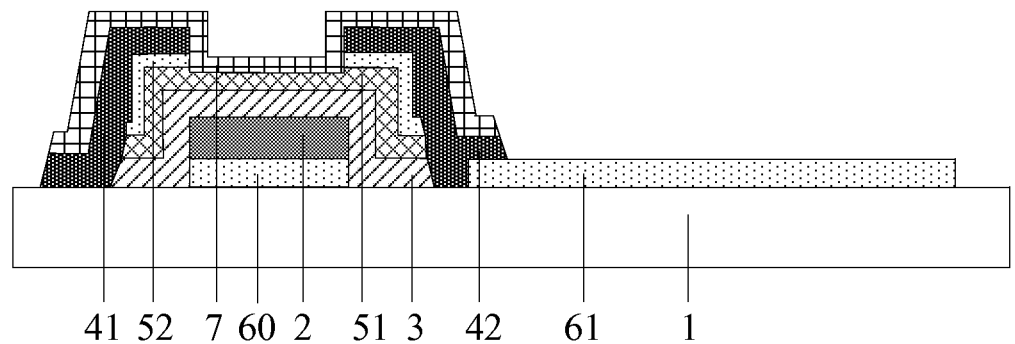
FIG. 2 is a structural schematic diagram illustrating an array substrate according to some embodiments of the disclosure.

According to some embodiments of the disclosure, an array substrate is provided. The array substrate comprises the TFT mentioned above. For example, as shown in FIG. 2, the array substrate comprises a substrate 1, a gate electrode 2, a gate line (not shown), a gate insulating layer 3, a semiconductor active layer 51, an ohmic contact layer 52, a source electrode 41, a drain electrode 42 and a data line (not shown). For example, the array substrate further comprises a transparent conductive layer 60 and a transparent conductive electrode 61 provided on the substrate 1, the transparent conductive layer 60 is provided below the gate electrode 2, and the transparent conductive electrode 61 is provided in a same layer as the transparent conductive layer 60.

The array substrate according to the embodiments of the disclosure is applicable to the liquid crystal display device of twisted nematic (TN) mode. In this case, the transparent conductive electrode 61 is served as a pixel electrode and is electrically connected to the drain electrode 42 of the TFT, as shown in FIG. 2.

The array substrate according to the embodiments of the disclosure is also applicable to the liquid crystal display device of advanced super dimension switch (ADSDS, ADS for short) mode. In this case, the transparent conductive electrode 61 is served as the pixel electrode and is electrically connected to the drain electrode, or it is served as a common electrode and is not electrically connected to the drain electrode. In the liquid crystal display panel of ADS mode, a multi-dimensional electric field is formed with both an electric field generated at edges of slit electrodes in a same plane and an electric field generated between a slit electrode layer and a plate-like electrode layer, so that liquid crystal molecules at all orientations, which are provided directly above the electrodes or between the slit electrodes in a liquid crystal cell, can be rotated, In this way, the work efficiency of liquid crystal can be enhanced and the light transmittance can be increased. The ADS mode can improve the image quality of the thin film transistor liquid crystal display and has advantages of high resolution, high transmittance, low power consumption, wide viewing angle, high aperture ratio, low chromatic aberration, high response speed, free of push Mura, etc. Furthermore, the improvements of ADS mode comprise I-ADS technology with a high-transmittance, H-ADS technology with a high aperture ratio, S-ADS technology with a high-resolution and the like.

It should be noted that, the array substrate according to the embodiments of the disclosure is also applicable to the liquid crystal display device of other modes, such as VA mode, IPS mode, FFS mode, etc.

In addition, the array substrate according to the embodiments of the disclosure further comprises a passivation layer 7 provided on the source electrode 41, the drain electrode 42 and the active layer 51. The passivation layer 7 protects the TFT so as to prevent the TFT from being damaged, and simultaneously, the passivation layer 7 has an insulating property so as to avoid interference from external electric signal on the TFT.

According to some embodiments of the disclosure, a TFT manufacturing method is provided. The method comprises the following steps.

S11: forming a gate electrode, a gate insulating layer, a semiconductor active layer and an ohmic contact layer on a substrate;

S12: exposing and developing a photoresist on the substrate from a back side of the substrate by taking the gate electrode as a mask plate, wherein a remaining portion of the photoresist after exposing and developing is in correspondence with a position of the gate electrode;

S13: depositing a source-drain metal thin film on the substrate;

S14: stripping off the remaining portion of the photoresist and the source-drain metal thin film on the remaining portion of the photoresist to form a gap between a source electrode and a drain electrode of the thin film transistor;

S15: etching the ohmic contact layer in the gap;

S16: etching the source-drain metal thin film to form the source electrode and the drain electrode.

For example, in the step S12, the photoresist on the substrate is a remaining portion of another photoresist adopted by step S11. For example, in the step S12, the photoresist on the substrate is a photoresist which is coated on the substrate after step S11 is completed.

According to some embodiments of the disclosure, a manufacturing method of an array substrate is further provided. The method comprises the following steps.

S1: forming a gate electrode, a gate line, a gate insulating layer, a semiconductor active layer, an ohmic contact layer and a transparent conductive electrode on a substrate.

For example, the transparent conductive electrode is served as a pixel electrode.

For example, this step adopts dual-tone mask plates (for example, a gray-tone mask plate or a half-tone mask plate), and comprises the following steps.

S101: sequentially depositing a transparent conductive thin film and a gate metal thin film on the substrate.

For example, the transparent conductive thin film and the gate metal film are sequentially deposited on the substrate with a magnetron sputtering method. For example, the transparent conductive thin film is made of indium tin oxide (ITO), indium zinc oxide (IZO), aluminum zinc oxide, etc., and is 400 Å-1500 Å thick. For example, the gate metal film has a single-layer structure made of molybdenum (Mo), aluminum (Al), copper (Cu), tungsten (W), etc., or has a multi-layer structure made of the metals mentioned above. For example, the gate metal film is 1500 Å-2500 Å thick.

S102: coating a layer of photoresist on the substrate, exposing and developing the photoresist through the dual-tone mask plate (for example, a gray-tone mask plate or a half-tone mask plate), so as to form a photoresist-completely-reserved region, a photoresist-partially-reserved region and a photoresist-completely-removed region. The photoresist-completely-reserved region corresponds to a region where the gate electrode and the gate line are to be formed, the photoresist-partially-reserved region corresponds to a region where the transparent conductive electrode is to be formed, and the remaining region is the photoresist-completely-removed region.

S103: etching the gate metal thin film and the transparent conductive thin film of the photoresist-completely-removed region through an etching process, to form the gate electrode and the gate line. For example, a wet etching process is adopted.

S104: removing the photoresist of the photoresist-partially-reserved region by an ashing process. Meanwhile, the photoresist of the photoresist-completely-reserved region is removed by a certain thickness, but the photoresist still covers the photoresist-completely-reserved region.

S105: etching the gate metal thin film of the photoresist-partially-reserved region through an etching process. That is, the gate metal thin film in the region where the transparent conductive electrode is to be formed is removed by the etching process to expose the transparent conductive thin film, so that the transparent conductive electrode is formed. For example, the wet etching process is adopted.

S106: stripping off the photoresist of the photoresist-completely-reserved region.

Figure 3A:
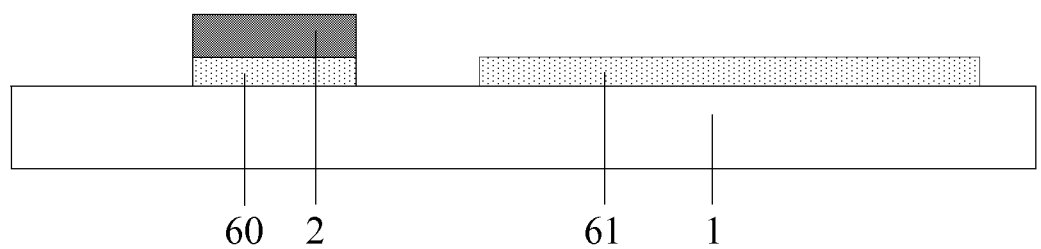
FIGS. 3a-3g are schematic diagrams illustrating a manufacturing method of an array substrate according to some embodiments of the disclosure.

So far, the first patterning process using the dual-tone mask plate is completed. As shown in FIG. 3a, through this patterning process, the gate electrode 2, the gate line (not shown) and the transparent conductive electrode 61 are formed on the substrate 1. As shown in FIG. 3a, the gate electrode 2 has a dual-layer structure formed by the transparent conductive thin film and the gate metal thin film, thus the conductivity of the gate electrode 2 is improved.

S107: sequentially depositing a gate insulating layer thin film, a semiconductor active layer thin film and an ohmic contact layer thin film on the substrate.

For example, the gate insulating layer thin film is deposited through a plasma enhanced chemic vapor deposition (PECVD) method. For example, the gate insulating layer thin film has a single-layer structure made of SiNx or SiOx or has a multi-layer structure made of SiNx and SiOx. For example, the gate insulating layer is 2500 Å-4000 Å thick. The semiconductor active layer thin film is then deposited to be 800 Å-1500 Å thick. Next, the ohmic contact layer thin film is deposited to be 500 Å-1000 Å thick.

S108: coating a layer of photoresist on the substrate, exposing and developing the photoresist through a dual-tone mask plate, so as to form a photoresist-completely-reserved region, a photoresist-partially-reserved region and a photoresist-completely-removed region. The photoresist-completely-reserved region corresponds to a region where the active layer of the TFT is to be formed, the photoresist-partially-reserved region corresponds to a region where the gate line is formed, and the remaining region is the photoresist-completely-removed region.

S109: etching the ohmic contact layer thin film, the semiconductor active layer thin film and the gate insulating layer thin film of the photoresist-completely-removed region through an etching process, to form the semiconductor active layer and the ohmic contact layer.

Figure 3B:
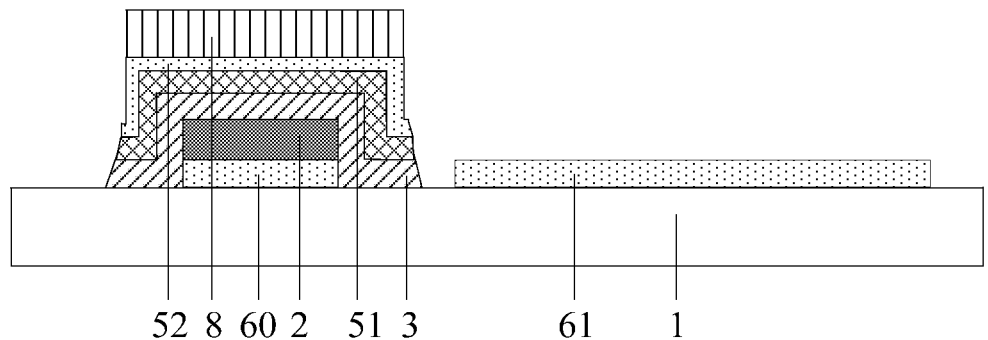

For example, a dry etching process is adopted. Etching gas for etching the semiconductor active layer thin film is a gas mixture of $SiH_4$ and $H_2$ or a gas mixture of $SiH_2Cl_2$ and $H_2$. Etching gas for etching the ohmic contact layer thin film is a gas mixture of $SiH_4$, $PH_3$ and $H_2$ or a gas mixture of $SiH_2C_{12}$, $PH_3$ and $H_2$. Etching gas for etching the gate insulating layer thin film is a gas mixture of $SiH_4$, $NH_3$ and $N_2$ or a gas mixture of $SiH_2C_{12}$, $NH_3$ and $N_2$. After this step S109, the ohmic contact layer thin film, the semiconductor active layer thin film and the gate insulating layer thin film are only retained in the region where the active layer of the TFT is formed and the region where the gate line is formed, as shown in FIG. 3b.

S110: removing the photoresist of the photoresist-partially-reserved region by an ashing process. Similar with the above step S104, the photoresist of the photoresist-completely-reserved region is removed by a certain thickness while the photoresist of the photoresist-partially-reserved region is removed, and the photoresist still covers the photoresist-completely-reserved region.

S111: etching the ohmic contact layer thin film and the semiconductor active layer thin film of the photoresist-partially-reserved region through an etching process. That is, the ohmic contact layer thin film and the semiconductor active layer thin film in the region where the gate line is formed are removed to form the gate insulating layer covering the gate line. For example, the dry etching process is adopted. The resultant structure is shown in FIG. 3b, and the photoresist of the photoresist-completely-reserved region still completely covers the photoresist-completely-reserved region.

It should be noted that in the above step S1, the gate electrode, the gate line, the gate insulating layer, the semiconductor active layer, the ohmic contact layer and the transparent conductive electrode may be formed through patterning processes with normal mask plates. For example, the transparent conductive electrode and the transparent conductive layer are formed through a first patterning process with the normal mask plate, the gate electrode and the gate line are formed through a second patterning process with the normal mask plate, the gate insulating layer is formed through a third patterning process with the normal mask plate, and the semiconductor active layer and the ohmic contact layer are formed through a fourth patterning process with the normal mask plate, and the remaining portion of the photoresist on the ohmic contact layer is remained so as to be used in later step S2.

Figure 3C:
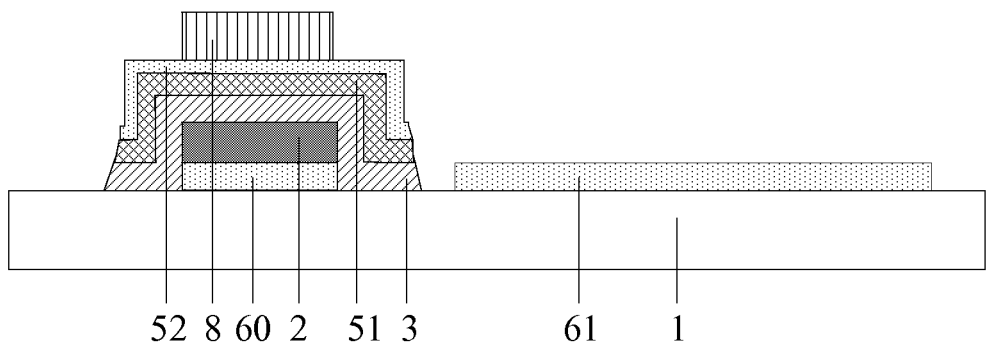

S2: as shown in FIG. 3c, exposing and developing the photoresist on the substrate 1 from a back side of the substrate 1 by taking the gate electrode 2 as a mask plate, wherein the remaining photoresist 8 after exposing and developing is in correspondence with the position of the gate electrode 2.

The gate electrode 2, which is made of metal materials, is capable of blocking light. The photoresist is exposed and developed from the back side of the substrate 1 with the gate electrode 2 as the mask plate so that the remaining photoresist 8 after exposing and developing is in correspondence with the position of the gate electrode 2.

Figure 3D:
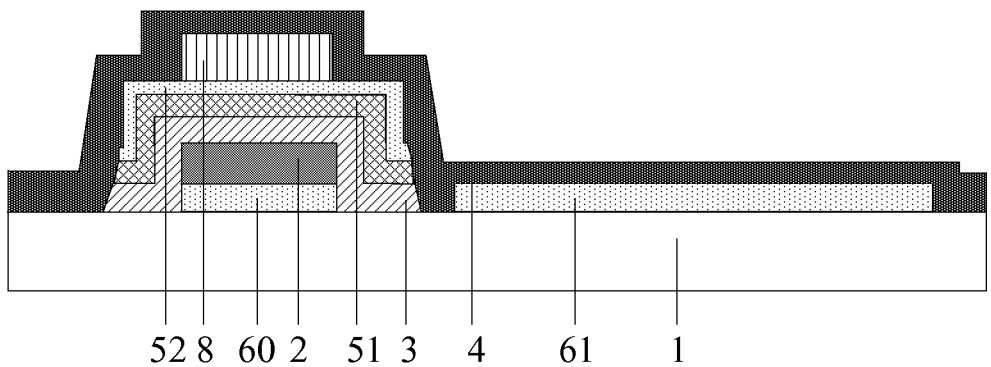

S3: as shown in FIG. 3d, depositing a source-drain metal thin film 4 on the substrate 1.

For example, the source-drain metal thin film 4 is deposited with a magnetron sputtering method or a thermal evaporation method. For example, the source-drain metal thin film 4 is made of same materials with the gate metal thin film, and is 2000 Å-3000 Å thick.

S4: stripping off the remaining photoresist on the ohmic contact layer and the source-drain metal thin film on the remaining portion of the photoresist, to form a gap between a source electrode and a drain electrode of the TFT.

For example, a normal photoresist stripping manner is adopted. It should be noted that FIG. 3d is a schematic diagram only; in actual manufacturing process, the thickness of the photoresist 8 is of the order of micrometer and the thickness of the source-drain meal thin film 4 is of the order of nanometer, i.e., the photoresist 8 is greatly thicker than the source-drain metal thin film 4. Therefore, the source-drain metal thin film 4 on the photoresist 8 is simultaneously removed when the photoresist 8 is stripped off, and the gap formed between the source electrode and the drain electrode of the TFT is exactly in correspondence with the position of the gate electrode 2.

Figure 3E:
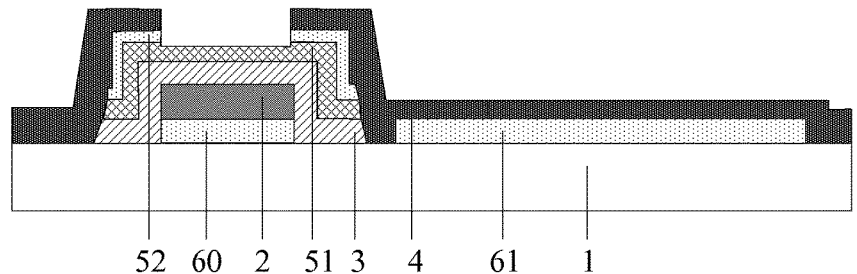

S5: etching the ohmic contact layer in the gap, as shown in FIG. 3e.

For example, the ohmic contact layer 52 in the gap is etched through a dry etching process. For example, in the actual etching process, etching time is prolonged so that the ohmic contact layer 52 is completely etched and the semiconductor active layer 51 is etched just by a small portion without affecting the electrical performance of the TFT.

So far from the step S107, the second pattering process with the dual-tone mask plate is completed. As shown in FIG. 3e, the gate insulating layer 3, the semiconductor active layer 51, the ohmic contact layer 52 as well as the gap between the source electrode and the drain electrode of the TFT are formed through the second pattering process on the basis of the first pattering process, and a projection of the gap on the substrate 1 exactly coincides with the gate electrode 2.

S6: forming the source electrode, the drain electrode, a data line and a passivation layer on the substrate.

For example, this step adopts a dual-tone mask plate and comprises the following steps.

Figure 3F:
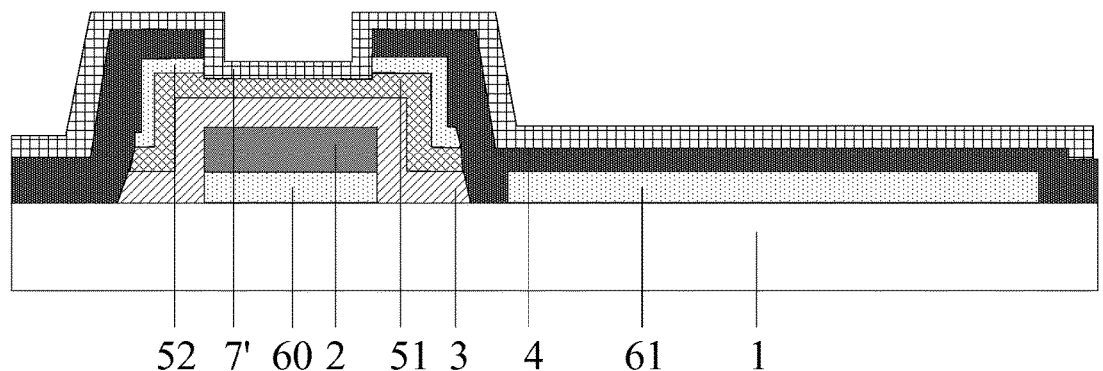

S601: as shown in FIG. 3f, depositing a passivation layer thin film 7' on the substrate 1.

For example, the passivation layer thin film 7' is deposited with a PECVD method. For example, the passivation layer thin film 7' has a single-layer structure made of SiNx or SiOx or has a multi-layer structure made of SiNx and SiOx. For example, the passivation layer thin film 7' is 1000 Å-3000 Å thick.

S602: coating a layer of photoresist on the substrate, exposing and developing the photoresist through the dual-tone mask plate, so as to form a photoresist-completely-reserved region, a photoresist-partially-reserved region and a photoresist-completely-removed region. The photoresist-completely-reserved region corresponds to a region where the active layer of the TFT is formed, the photoresist-partially-reserved region corresponds to a region where the data line is formed, and the remaining region is the photoresist-completely-removed region.

S603: etching the passivation layer thin film 7' of the photoresist-completely-removed region through an etching process.

For example, a dry etching process is adopted. Etching gas for etching the passivation layer thin film 7' is a gas mixture of $SiH_4$, $NH_3$ and $N_2$ or a gas mixture of $SiH_2Cl_2$, $NH_3$ and $N_2$.

S604: etching the source-drain metal thin film of the photoresist-completely-removed region through an etching process. For example, the wet etching process is adopted.

The pixel electrode is located in the photoresist-completely-removed region. In this step, the source-drain metal thin film is etched in the photoresist-completely-removed region, that is, the source-drain metal thin film on the surface of the pixel electrode is etched to expose the pixel electrode.

S605: removing the photoresist of the photoresist-partially-reserved region by an ashing process. Similar with steps S104 and S110, the photoresist of the photoresist-completely-reserved region is removed by a certain thickness while the photoresist of the photoresist-partially-reserved region is removed, but the photoresist still covers the photoresist-completely-reserved region.

S606: etching the passivation layer thin film of the photoresist-partially-reserved region through an etching process. For example, the dry etching process is adopted.

Through a process same as step S603, the passivation layer thin film of the photoresist-partially-reserved region is etched to expose the source-drain metal thin film, so as to form the data line.

Figure 3G:
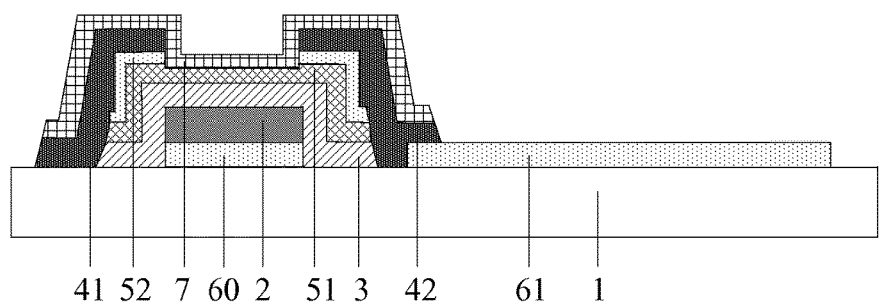

S607: stripping off the remaining photoresist of the photoresist-completely-reserved region, to form the array substrate, as shown in FIG. 3g.

So far from step S601, the third patterning process with the dual-tone mask plate is completed. The source electrode 41, the drain electrode 42, the data line (not shown) and the passivation layer 7 are formed through the patterning process on the basis of the previous two patterning processes.

It should be noted that, in the step S6, the source electrode, the drain electrode, the data line and the passivation layer may be formed through patterning processs with normal mask plates.

In the array substrate and the manufacturing method thereof according to the embodiments of the disclosure, the photoresist is exposed and developed from the back side of the substrate by taking the light-tight gate electrode as the mask plate, and the remaining photoresist after exposing and developing is exactly in correspondence with the position of the gate electrode. When the remaining photoresist is stripped off, the source-drain metal thin film on the remaining photoresist is simultaneously removed, so that the gap between the source electrode and the drain electrode is exactly in correspondence with the position of the gate electrode, i.e., the projection of the gap on the substrate exactly coincides with the gate electrode. In this way, the source electrode and the drain electrode do not overlap with the gate electrode, so that both $C_{gs}$ and $C_{gd}$ are equal to 0. Accordingly, the uneven chromaticity is avoided, the driving voltage of the TFT is reduced and the duration required by the charging process is shortened.

In addition, according to the embodiments of the disclosure, the array substrate is manufactured by three patterning processes with dual-tone mask plates, and thus the manufacture efficiency of the array substrate is improved and the manufacture cost of the array substrate is reduced.

According to some embodiments of the disclosure, a display device is provided. The display device comprises the array substrate as described above. The display device is any product or component having a display function, such as a liquid crystal panel, an electronic paper, an OLED panel, an LCD TV, an LCD, a digital photo frame, a mobile phone, a tablet PC, etc.

The foregoing embodiments merely are exemplary embodiments of the disclosure, and not intended to define the scope of the disclosure, and the scope of the disclosure is determined by the appended claims.

What is claimed is:

1. A manufacturing method of a thin film transistor, comprising:
    forming a gate electrode, a gate insulating layer, a semiconductor active layer and an ohmic contact layer on a substrate;
    exposing and developing a photoresist on the substrate from a back side of the substrate by taking the gate electrode as a mask plate, wherein a remaining portion of the photoresist after exposing and developing covers the gate electrode;
    forming a source-drain metal thin film on the substrate;
    stripping off the remaining portion of the photoresist and the source-drain metal thin film on the remaining portion of the photoresist to form a gap between a source electrode and a drain electrode of the thin film transistor;
    etching the ohmic contact layer in the gap; and
    etching the source-drain metal thin film to form the source electrode and the drain electrode.

2. A manufacturing method of an array substrate, comprising:
    forming a gate electrode, a gate line, a gate insulating layer, a semiconductor active layer, an ohmic contact layer and a transparent conductive electrode on a substrate;
    exposing and developing a photoresist on the substrate from a back side of the substrate by taking the gate electrode as a mask plate, wherein a remaining portion of the photoresist after exposing and developing covers the gate electrode;
    forming a source-drain metal thin film on the substrate;
    stripping off the remaining portion of the photoresist on the ohmic contact layer and the source-drain metal thin film on the remaining portion of the photoresist, to form a gap between a source electrode and a drain electrode of a TFT;
    etching the ohmic contact layer in the gap; and
    forming the source electrode, the drain electrode, a data line and a passivation layer on the substrate.

3. The method according to claim 2, wherein the step of forming the gate electrode, the gate line, the gate insulating layer, the semiconductor active layer, the ohmic contact layer and the transparent conductive electrode on the substrate comprises:
    sequentially forming a transparent conductive thin film and a gate metal thin film on the substrate;
    coating a layer of photoresist on the substrate, exposing and developing the photoresist through a dual-tone mask plate so as to form a photoresist-completely-reserved region, a photoresist-partially-reserved region and a photoresist-completely-removed region, wherein the photoresist-completely-reserved region corresponds to a region where the gate electrode and the gate line are to be formed, the photoresist-partially-reserved region corresponds to a region where the transparent conductive electrode is to be formed, and a remaining region is the photoresist-completely-removed region;

etching the gate metal thin film and the transparent conductive thin film of the photoresist-completely-removed region through an etching process, to form the gate electrode and the gate line;

removing the photoresist of the photoresist-partially-reserved region by an ashing process;

etching the gate metal thin film of the photoresist-partially-reserved region through an etching process;

stripping off the photoresist of the photoresist-completely-reserved region;

sequentially forming a gate insulating layer thin film, a semiconductor active layer thin film and an ohmic contact layer thin film on the substrate;

coating a layer of photoresist on the substrate, exposing and developing the photoresist through a dual-tone mask plate so as to form a photoresist-completely-reserved region, a photoresist-partially-reserved region and a photoresist-completely-removed region, wherein the photoresist-completely-reserved region corresponds to a region where the active layer of the TFT is to be formed, the photoresist-partially-reserved region corresponds to a region where the gate line is formed, and a remaining region is the photoresist-completely-removed region;

etching the ohmic contact layer thin film, the semiconductor active layer thin film and the gate insulating layer thin film of the photoresist-completely-removed region through an etching process, to form the semiconductor active layer and the ohmic contact layer;

removing the photoresist of the photoresist-partially-reserved region by an ashing process;

etching the ohmic contact layer thin film and the semiconductor active layer thin film of the photoresist-partially-reserved region through an etching process; and reserving a remaining portion of photoresist of the photoresist-completely-reserved region.

4. The method according to claim 2, wherein the step of forming the source electrode, the drain electrode, the data line and the passivation layer on the substrate comprises:

forming a passivation layer thin film on the substrate;

coating a layer of photoresist on the substrate, exposing and developing the photoresist through the dual-tone mask plate so as to form a photoresist-completely-reserved region, a photoresist-partially-reserved region and a photoresist-completely-removed region, wherein the photoresist-completely-reserved region corresponds to a region where the active layer of the TFT is formed, the photoresist-partially-reserved region corresponds to a region where the data line is formed, and a remaining region is the photoresist-completely-removed region;

etching the passivation layer thin film of the photoresist-completely-removed region through an etching process;

etching the source-drain metal thin film of the photoresist-completely-removed region through an etching process;

removing the photoresist of the photoresist-partially-reserved region by an aching process;

etching the passivation layer thin film of the photoresist-partially-reserved region through an etching process; and stripping off a remaining portion of the photoresist of the photoresist-completely-reserved region.

5. The method according to claim 2, wherein
the array substrate further comprises a transparent conductive layer provided on the substrate; and
the transparent conductive layer is provided below the gate electrode of the TFT, and the transparent conductive electrode is provided in a same layer as the transparent conductive layer.

6. The method according to claim 2, wherein the transparent conductive electrode is served as a pixel electrode and is electrically connected to the drain electrode of the TFT.

* * * * *